(12) United States Patent
Hillman

(10) Patent No.: US 8,906,452 B1
(45) Date of Patent: Dec. 9, 2014

(54) RAPID COATING OF WAFERS

(76) Inventor: Gary Hillman, Livingston, NJ (US)

(*) Notice: Subject to any disclaimer, the term of this patent is extended or adjusted under 35 U.S.C. 154(b) by 0 days.

(21) Appl. No.: 13/479,626

(22) Filed: May 24, 2012

Related U.S. Application Data

(60) Provisional application No. 61/493,146, filed on Jun. 3, 2011.

(51) Int. Cl.
*B05D 3/04* (2006.01)
*B05D 3/12* (2006.01)

(52) U.S. Cl.
USPC .......... 427/240; 427/8; 427/425; 118/708; 118/52; 118/320; 438/758; 438/780; 438/782

(58) Field of Classification Search
CPC .......... H01L 21/6715; H01L 21/67155; H01L 21/67098; G03F 7/162; B05D 1/005
USPC .......... 427/240, 425, 8; 118/52, 320, 708; 438/758, 780, 782
See application file for complete search history.

(56) References Cited

U.S. PATENT DOCUMENTS

| 4,347,302 | A  | * | 8/1982  | Gotman      | 430/270.1 |
|-----------|----|---|---------|-------------|-----------|
| 5,449,405 | A  |   | 9/1995  | Cardinali et al. | |
| 5,472,502 | A  | * | 12/1995 | Batchelder  | 118/52    |
| 5,919,520 | A  |   | 7/1999  | Tateyama et al. | |
| 6,228,561 | B1 |   | 5/2001  | Hasebe et al. | |
| 6,503,003 | B2 |   | 1/2003  | Hasebe et al. | |
| 6,551,400 | B2 |   | 4/2003  | Hasebe et al. | |
| 2002/0127334 | A1 | * | 9/2002 | Gurer et al. | 427/240 |

* cited by examiner

*Primary Examiner* — Kirsten Jolley
(74) *Attorney, Agent, or Firm* — BainwoodHuang

(57) ABSTRACT

An improved technique achieves a uniform photoresist film on a wafer by controlling the volatility of the solvent in a photoresist solution during the bake process step. Because film formation takes place in the bake rather than the spin steps of the process, the improved technique involves using less viscous and therefore less costly and easier to use resists to cast relatively thick photoresist films. Such control is achieved in an enclosed chamber into which a carrier gas is introduced; the carrier gas mixes with gaseous solvent to create a saturating atmosphere in which the rate of evaporation of solvent decreases. This enables the heating of the wafer without the reduction of solvent in the film so that the photoresist can self-level. When the film has self-leveled, the solvent is then baked off as usual.

6 Claims, 5 Drawing Sheets

RAPID COATING OF WAFERS

CROSS REFERENCE TO RELATED APPLICATIONS

This Patent Application claims the benefit under 35 U.S.C. §119(e) of U.S. Provisional Patent Application No. 61/493,146 filed on Jun. 3, 2011, entitled, "RAPID COATING OF WAFERS," the contents and teachings of which are hereby incorporated by reference in their entirety.

BACKGROUND

In general, photolithography is a process by which circuit patterns are defined on a semiconductor wafer in high-volume electronics manufacturing. The circuit patterns are transferred from a photomask onto a layer of light-sensitive photoresist on a wafer. For positive photoresist, an application of developer washes away those areas of the photoresist exposed to light. (For negative tone resist the developer washes away the unexposed areas.) The resulting photoresist pattern on the wafer defines the circuit pattern, as metal or other useful films underneath the photoresist will not be cut away in an etching device. On some occasions the patterned photoresist is used as a "mold" into which metal is deposited usually by a plating process, at the completion of the plating process the photoresit is removed leaving the metal posts or plateaus.

Before the pattern is ready to be transferred onto the layer of photoresist, the photoresist is delivered to the wafer surface via spin coat processes. In a conventional spin coat process, a fluid which includes a polymer photoresist and a solvent is deposited in the center of the wafer; subsequently the wafer is rapidly spun. The fluid is pushed to the edge of the wafer by the spinning motion, creating a uniform film as excess solution is pushed beyond the edge. The coated wafer is then placed on a hot plate for a post-apply bake; the remaining solvent is removed by this bake, leaving a firm coat of photoresist. Once the wafer is cooled and the resist sufficiently hardened, the photoresist is ready for exposure.

The thickness of the photoresist layer depends on the particular circuit pattern being transferred. For example, in back-end-of-line (BEOL) processing, which encompasses contact, via, and various metal levels of an electronic device, the photoresist layer typically has a thickness greater than 10 μm. Other levels, such as those developed in front-end-of-line (FEOL) processing, may have substantially thinner photoresist layers.

During the conventional spin coat process, there occurs some evolution of the solvent so that, at the completion of the spin, some drying of the photoresist solution has occurred and the photoresist solution becomes far more viscous and stable than at the beginning of the spin coat process. To reach such stability, conventional spin coat processes for BEOL processes typically take on the order of 60 seconds or more to complete.

SUMMARY

Unfortunately, the above-described conventional spin coat process suffers from a number of deficiencies. For example, the conventional spin coat process wastes a significant amount of photoresist. In order to achieve adequate coverage of photoresist on the wafer, an excess of about 70% of the amount of material which remains as a spin cast film on the wafer is typically wasted. Because this material is specifically engineered for various processes, the material tends to be expensive; such waste, then, adds substantial cost to electronics production.

Moreover, the conventional spin coat process are designed for relatively thin films between about 100 nanometers and about 2 microns used in FEOL processes. To make thicker films needed for BEOL processes, such a spin coat process employs more viscous resists, carries out multiple applications to build up the photoresist thickness, or both.

In contrast to the conventional spin coat process which can be costly and wasteful for BEOL processing, an improved technique achieves a uniform photoresist film on a wafer by controlling the volatility of the solvent in a photoresist solution during the bake process step. Because film formation takes place in the bake rather than the spin steps of the process, the improved technique involves using less viscous and therefore less costly and easier to use resists to cast relatively thick photoresist films. Such control is achieved in an enclosed chamber into which a carrier gas is introduced; the carrier gas mixes with gaseous solvent to create a saturating atmosphere in which the rate of evaporation of solvent decreases. This enables the heating of the wafer without the reduction of solvent in the film so that the photoresist can self-level. When the film has self-leveled, the solvent is then baked off as usual. A spin coat process is still utilized, but in the improved technique, the spin coat is used to bring photoresist solution to the edge or slightly over the edge of the wafer; once the solution reaches the wafer edge, the wafer is transferred while still wet to the enclosed bake chamber.

Advantageously, the improved technique reduces cost and processing time to provide a uniform coating of photoresist across a wafer for BEOL processing. Because a spin coat process is used only until photoresist solution completely reaches the edge of the wafer, little photoresist is wasted. Also, because the photoresist film is formed in the heated chamber by slowly raising the temperature of a substrate in the enclosed chamber, the photoresist solution will self level as the viscosity of the solution is lowered by mild heating while, at the same time, solvent evolution is countered by an increased partial pressure of the solvent. Further, thick films of photoresist may be formed in this manner in a single process step. Moreover, a further benefit of reduced photoreist viscosity is the enhanced ability of the lower viscosity material to "flow around" and fill in relatively large structures without the necessity of using an excess of resist to "soak" the wafer surface.

One embodiment of the improved technique is directed to a method of coating a wafer with a film of photoresist having a uniform thickness profile across the wafer. The method includes depositing a specified amount of a photoresist solution on a top surface of a wafer, the photoresist solution including a photoresist and a solvent, the specified amount of photoresist solution configured to provide a particular thickness of photoresist on the wafer upon evaporation of the solvent. The method also includes controlling a volatility of the photoresist solution to allow the solvent of the photoresist solution to evaporate at a specified rate concurrently with the photoresist of the photoresist solution forming a film having a uniform thickness profile at the particular thickness on the wafer.

Additionally, some embodiments of the improved technique are directed to a wafer coating system configured to coat a wafer with a film of photoresist having a uniform thickness profile across the wafer. The wafer coating system includes a resist depositing apparatus that is constructed and arranged to deposit a specified amount of a photoresist solution on the top surface of the wafer, the photoresist solution including a photoresist and a solvent, the specified amount of photoresist solution configured to provide a particular thickness of photoresist on the wafer upon evaporation of the solvent. The wafer coating system also includes a solvent volatility control device that is constructed and arranged to control a volatility of the photoresist solution to allow the solvent of the photoresist solution to evaporate at a specified rate concurrently with the photoresist of the photoresist solution forming a film having a uniform thickness profile at the particular thickness on the wafer. The wafer coating system further includes a controller constructed and arranged to control the resist depositing apparatus and the solvent volatility control device.

Furthermore, some embodiments of the improved technique are directed to a computer program product having a non-transitory computer readable storage medium which stores code including a set of instructions to carry the method of coating a wafer with a film of photoresist having a uniform thickness profile across the wafer.

BRIEF DESCRIPTION OF THE DRAWING

The foregoing and other objects, features and advantages will be apparent from the following description of particular embodiments of the invention, as illustrated in the accompanying figures in which like reference characters refer to the same parts throughout the different views.

DETAILED DESCRIPTION

An improved technique achieves a uniform photoresist film on a wafer by controlling the volatility of the solvent in a photoresist solution during the bake process step. Because film formation takes place in the bake rather than the spin steps of the process, the improved technique involves using less viscous and therefore less costly and easier to use resists to cast relatively thick photoresist films. Such control is achieved in an enclosed chamber into which a carrier gas is introduced; the carrier gas mixes with gaseous solvent to create a saturating atmosphere in which the rate of evaporation of solvent decreases. This enables the heating of the wafer without the reduction of solvent in the film so that the photoresist can self-level. When the film has self-leveled, the solvent is then baked off as usual. A spin coat process is still utilized, but in the improved technique, the spin coat is used to bring photoresist solution to the edge or slightly over the edge of the wafer; once the solution reaches the wafer edge, the wafer is transferred while still wet to the enclosed bake chamber.

Advantageously, the improved technique reduces cost and processing time to provide a uniform coating of photoresist across a wafer for BEOL processing. Because a spin coat process is used only until photoresist solution completely reaches the edge of the wafer, little photoresist is wasted. Also, because the photoresist film is formed in the heated chamber by slowly raising the temperature of a substrate in the enclosed chamber, the photoresist solution will self level as the viscosity of the solution is lowered by mild heating while, at the same time, solvent evolution is countered by an increased partial pressure of the solvent. Further, thick films of photoresist may be formed in this manner in a single process step.

Figure 1:
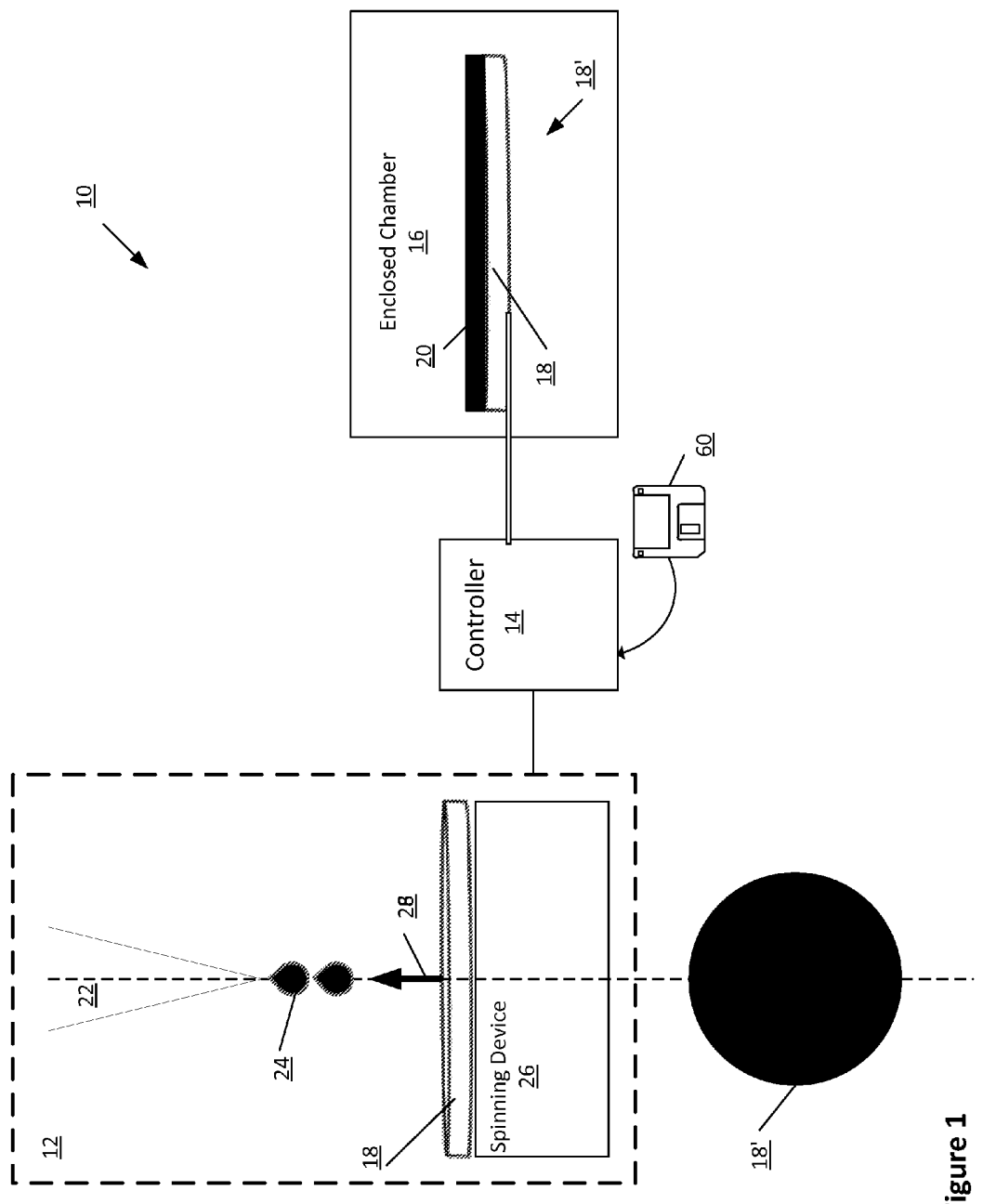
FIG. 1 is a block diagram illustrating an example wafer coating system for carrying out the improved technique.

FIG. 1 illustrates a wafer coating system 10 for carrying out the improved technique. Wafer coating system 10 includes resist depositing apparatus 12, controller 14, and enclosed chamber 16.

Resist depositing apparatus 12 is constructed and arranged to deposit a photoresist solution on the top surface of a wafer 18. Resist depositing apparatus 12 includes a nozzle, and a spinning device 26. In some arrangement, resist depositing apparatus 12 also includes a second nozzle (not pictured) for applying a pre-wet solvent to wafer 18.

Nozzle 22 is constructed and arranged to supply photoresist solution 24 to the wafer 18. In some arrangement, the rate of supply of photoresist solution 24 by nozzle 22 is adjustable. Photoresist solution 24 contains photoresist and a solvent. An example photoresist solution is AZ 4620, manufactured by AZ Electronic Materials USA, Branchburg, N.J. Examples of a solvent in such a photoresist solution include PGMEA, Ethyl lactate, and mixtures of such solvents.

Spinning device 26 is constructed and arranged to spin wafer 18 about an axis 28 normal to the top surface of wafer 18. The rate of spin of spinning device 26 is variable. In some arrangements, spinning device 26 is constructed and arranged to spin wafer 18 about axis 28' parallel to the top surface of wafer 18.

Enclosed chamber 16 is constructed and arranged to control the volatility, or rate of evaporation, of the solvent in photoresist solution 24. Further detail concerning enclosed chamber 16 will be described below with respect to FIGS. 2, 3, and 4.

Controller 14 is constructed and arranged to provide electronic control to resist depositing apparatus 12 and enclosed chamber 16. In some arrangements, controller 14 includes a robot arm configured to transport a wafer 18' on which photoresist solution has been deposited from resist depositing apparatus 12 to enclosed chamber 16.

During operation, wafer 18 is placed on spinning device 26 of resist depositing apparatus 12. In some arrangements, a robot places wafer 18 onto spinning device 26; in further arrangements, resist depositing apparatus 22 is part of a spin coater system in which the robot transfer wafer 18 between various components of the photoresist spin processor.

Once wafer 18 is placed on spinning device 26, spinning device 26 spins wafer 18 at a first angular velocity about an axis 28 normal to the top surface of wafer 18. In some arrangements, controller 14 controls the motion of spinning device 26, including an angular velocity schedule that, in some arrangements, is optimized for depositing photoresist solution 24 in the manner described below.

As spinning device 26 spins about axis 28, nozzle 22 deposits photoresist solution 24 onto wafer 18. In some arrangements, controller 14 controls the rate at which nozzle 22 releases photoresist solution 24. For example, controller 14 may set the release rate such that photoresist solution 24 is deposited on wafer 18 in 3 seconds. A tradeoff between release rate and processing speed is that excessively high release rates may result in some wasted photoresist solution 24 due to splashing.

Spinning device 26 spins wafer 18 until photoresist solution 24 reaches the edge of wafer 18. In some arrangements, detection of photoresist solution 24 at the edge of wafer 18 is effected by controller 14. In other arrangements, an amount of photoresist solution 24 is applied by nozzle 22 according to a computation that determines a photoresist solution profile on wafer 18 given a spin velocity schedule.

It should be understood that, in some arrangements, spinning device 26 may continue to spin wafer 18 until photoresist solution 24 begins to spill off wafer 18. Such spillage is typically kept to a minimum.

Once photoresist solution 24 has reached the edge of wafer 18, a wet coated wafer 18' is removed from spinning device 26. Wet coated wafer 18' includes a coat of wet photoresist solution on its top surface. It should be understood that little to no photoresist solution 24 has been wasted, as the spinning device 26 has stopped spinning before any significant quantity of solution spills over the edge of the wafer.

Wet coated wafer 18' is transferred to enclosed chamber 16. In some arrangements, a robot controlled by controller 14 automatically transfers wet coated wafer 18' to enclosed chamber 16.

Once in enclosed chamber 16, solvent in photoresist solution 24 on wet coated wafer 18' begins to evaporate. In the meantime, photoresist solution 24 on wet coated wafer 18' begins to even out over the top surface of wafer 18 due to gravitational effects. As solvent in photoresist solution 24 evaporates, the viscosity of photoresist solution 24 increases, hindering the ability of photoresist solution 24 to spread out over the top surface of wafer 18.

Enclosed chamber 16 controls the volatility, or evaporation rate, of photoresist solution 24 so that photoresist solution 24 can spread evenly over the top surface of wafer 18 while the solvent evaporates to produce a uniform coating of photoresist 20. Details concerning the control of the volatility of photoresist solution 24 in enclosed chamber 16 are described below with respect to FIGS. 2, 3, and 4.

Figure 2:
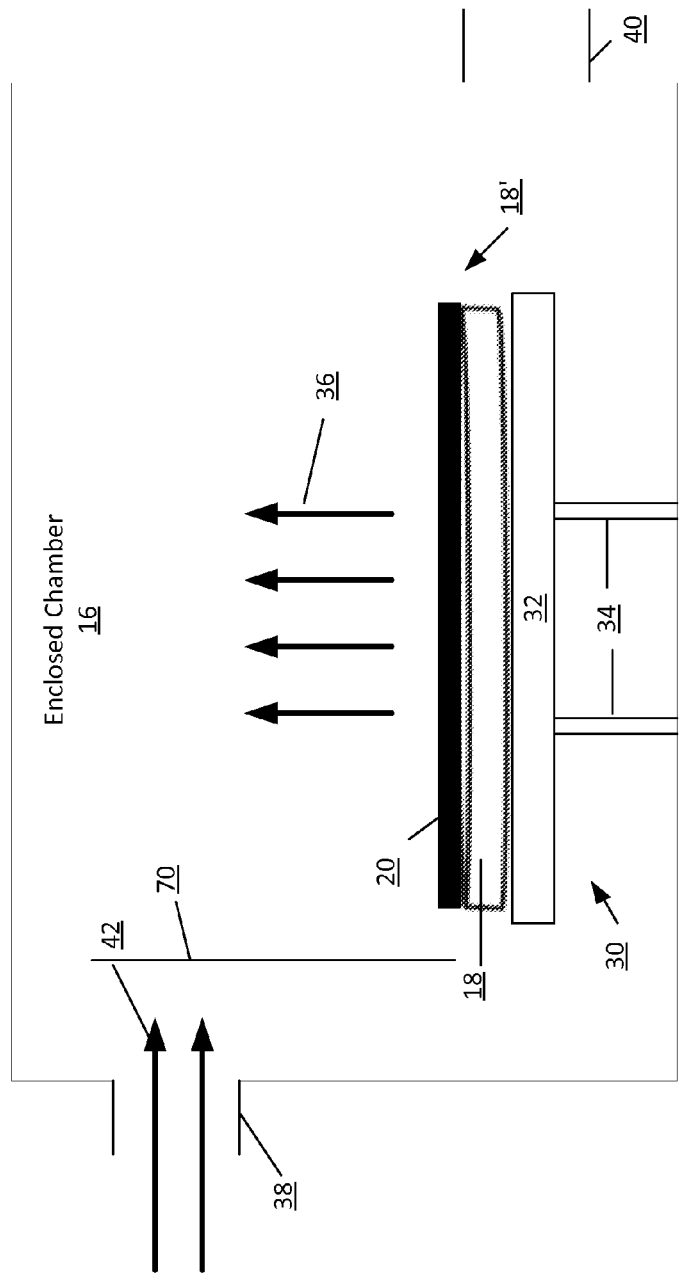
FIG. 2 is a block diagram illustrating an example enclosed chamber within the wafer coating system shown in FIG. 1.

FIG. 2 illustrates further details concerning enclosed chamber 16. Enclosed chamber 16 includes wafer support assembly 30, Inlet 38, outlet 40, and baffle 70.

Wafer support assembly 30 provides support for wet coated wafer 18'. Wafer support assembly 30 includes platform 32 and heating element 34. The wafer is slowly heated on platform 32, thereby warming platform 32, the effect of which is a further lowering of the viscosity of photoresist solution 24. Such a lowering of the viscosity of photoresist solution 24 enables the self leveling of photoresist film 20 without substantial removal of the solvent. Such a substantial removal of the solvent may have the unwanted effect of raising the viscosity of photoresist solution 24, thereby inhibiting the self leveling process.

In some arrangements, wafer 18 is placed on pins (not pictured) which are slowly lowered to the platform 32. The lowering of the pins to platform 32 allows an easier alternative to lowering the temperature of platform 32 directly, which may be practically difficult in situ. By lowering the pins toward platform 32, a similar slow raising of the temperature of photoresist solution 24 is effected.

Platform 32 includes a heat conductive material such as copper or aluminum. In some arrangement, platform 32 includes pins (not included) that support the wafer and can slowly lower the wafer either to contact or to close proximity with platform 32 during the final steps of the baking process. This baking process will ultimately remove most of the solvent and render the film dry and stable and, owing to the self leveling process in enclosed chamber 16, uniform.

Heating element 34 provides heat to wafer 18 via platform 32. Heating element 34 is typically electrically resistive wires, coils or rods that deliver heat (not pictured). In some arrangements, controller 14 (see FIG. 1) determines the amount of heat to deliver to platform 32 by controlling either the temperature of the heater, the rate of descent of the wafer (when pins effectively lower the wafer towards the plate), or both.

Inlet 38 is constructed and arranged to allow a carrier gas 42 to enter enclosed chamber 16 and bubble through solvent vapor 36. Inlet 38 is connected to a carrier gas source (not shown). Inlet 38 may be open or shut as needed during the photoresist forming process.

Carrier gas 42 is chosen for its resistance to combustion. In some arrangements, carrier gas 42 includes nitrogen ($N_2$). In other arrangements, carrier gas 42 includes oxygen ($O_2$), although in such arrangements ambient conditions within enclosed chamber 16 should be such that combustion of the $O_2$ is not supported.

Baffle 70 is constructed and arranged to direct carrier gas 42 to bubble up through the solvent.

During operation, once wet coated wafer 18' is placed on platform 32, an amount of carrier gas 42 containing solvent vapors which were acquired through bubbling through a solvent for photoresist solution 24 enters enclosed chamber 16 through inlet 38. As solvent bearing carrier gas 42 enters enclosed chamber 16, solvent in photoresist solution 24 has very limited evaporation owing to the back partial pressure of the solvent in carrier gas 42.

The carrier gas particles 42 and the solvent vapor particles 36 mix together to create a solvent/gas mixture. Details concerning the effect of the solvent/gas mixture on the photoresist film 20 are described with respect to FIG. 3 below.

Figure 3:
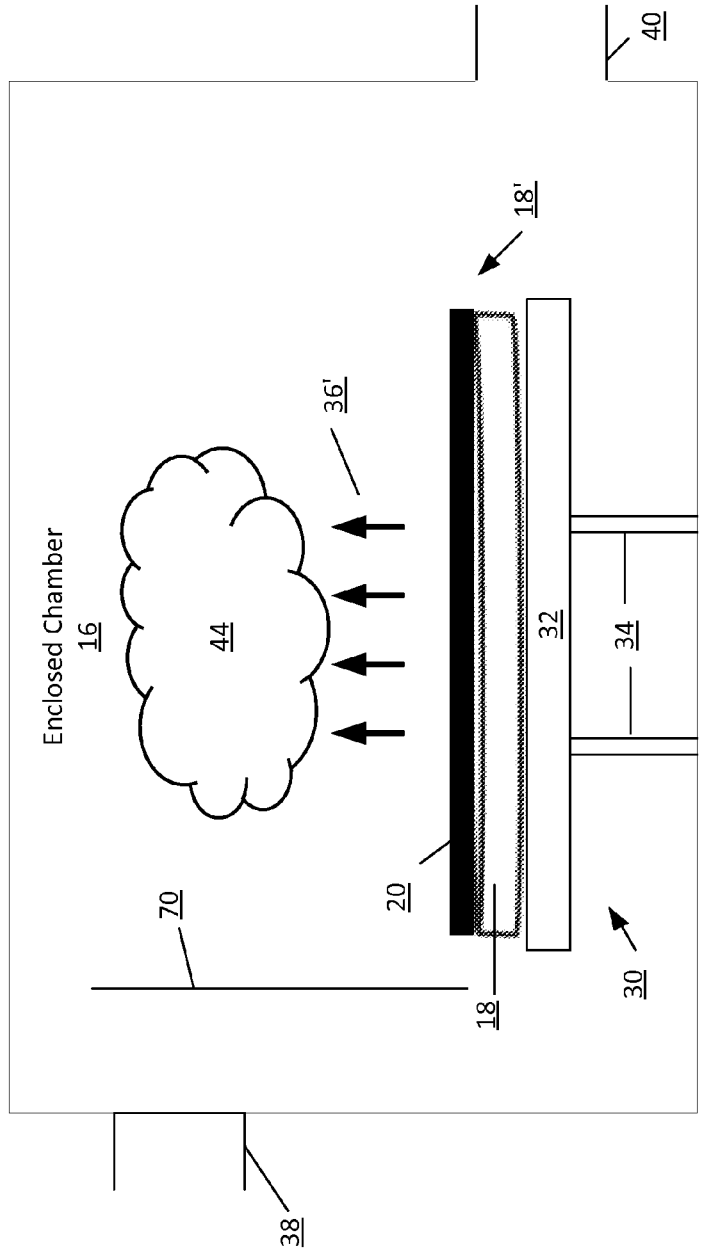
FIG. 3 is a block diagram illustrating an example enclosed chamber within the wafer coating system shown in FIG. 1.

FIG. 3 illustrates a situation in which carrier gas 42 bubbles through the solvent in photoresist solution 24 and mixes to create a partially pressurized atmosphere 44 that controls the volatility of the solvent in photoresist solution 24 (see FIG. 1).

Atmosphere 44 acts to saturate solvent in photoresist solution 24 and thereby lower its rate of evaporation. A smaller amount of solvent 36' then slowly evaporates away from wafer 18.

Because less solvent evaporates, the viscosity of photoresist solution 24 remains low enough that photoresist solution 24 may continue to spread itself over the top surface of wafer 18. On the other hand, the viscosity of photoresist solution 24 has increased enough due to the existing evaporation so that photoresist solution 24 will not easily spill over the edge of wafer 18. In this way, the volatility of the solvent of photoresist solution 24 may be controlled.

It should be understood that, in some arrangements, carrier gas 42 enters enclosed chamber 16 and is exhausted through outlet 40 in a continuous manner. In other arrangements, however, the inlet 38, outlet 40, or both may be closed off at some point during the volatility control process described above. For example, outlet 40 is slowly opened as the photoresist layer 20 that forms becomes a uniform layer of film. In this way, photoresist solution 24 may harden into photoresist film 20 more rapidly. In other arrangements, pins (not pictured) lower wafer 18 onto platform 32 to effect a gradual increase in temperature for controlling the viscosity of photoresist solution 24.

Through a judicious selection of an application rate of photoresist solution 24 from nozzle 22 (see FIG. 1), carrier gas volume, and evaporation time, one can specify a thickness of photoresist film 20. This thickness of photoresist film 20 can be as large as needed, e.g., greater than 20 μm.

At some point, photoresist solution 24 settles into the hard film of photoresist 20. Details of this settling are described with respect to FIG. 4 below.

Figure 4:
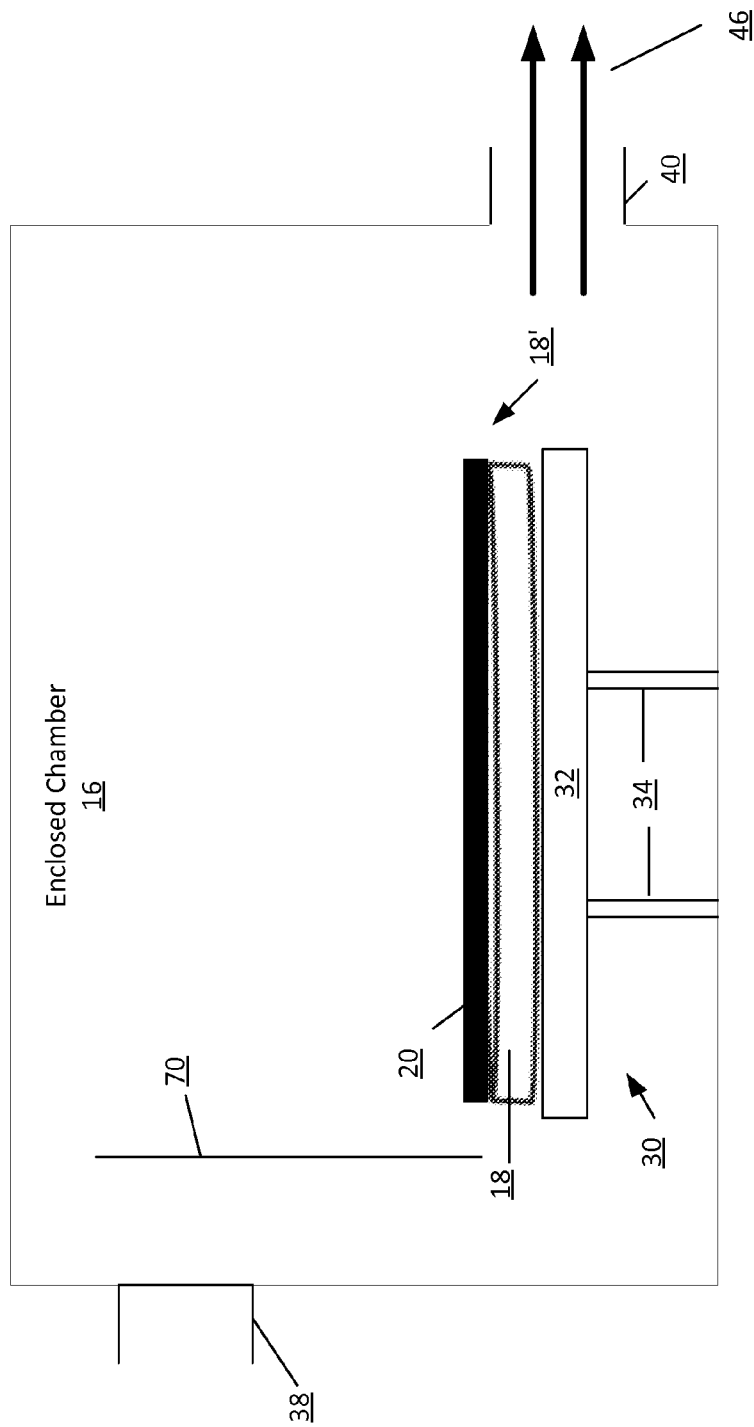
FIG. 4 is a block diagram illustrating an example enclosed chamber within the wafer coating system shown in FIG. 1.

FIG. 4 illustrates a situation where the photoresist film 20 has nearly formed into a uniform film on the top surface of wafer 18. The atmosphere 44 of carrier gas 42 and solvent 36 is let out of enclosed chamber 16 and any remaining solvent is evaporated from the wafer 18 as quickly as possible without distorting the film 20.

It should be understood that atmosphere 44 is evacuated through outlet 40 at a higher temperature than that at which carrier gas 42 was introduced into inlet 38, having been heated by the heated plate 32.

Wafer 18 with uniform film 20 of photoresist is then ready for exposure more quickly and with less waste, using less expensive and lower viscosity resists to cast thicker and more uniform films than in previous processes.

Figure 5:
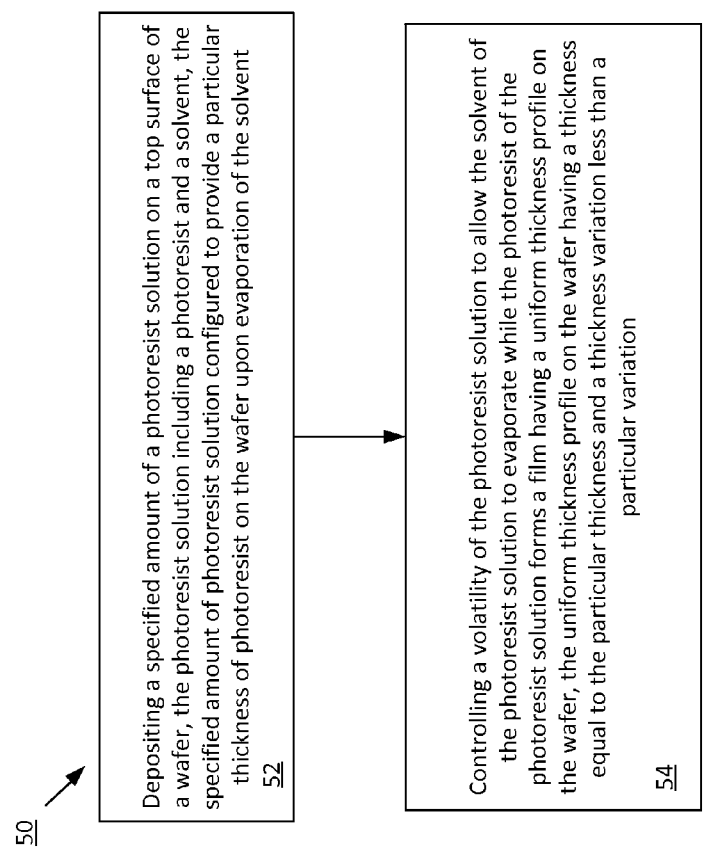
FIG. 5 is a flow chart illustrating a method of carrying out the improved technique with the wafer coating system shown in FIG. 1.

FIG. 5 illustrates a method of coating a wafer with a film of photoresist having a uniform thickness profile across the wafer. In step 52, an amount of a photoresist solution is deposited on a top surface of a wafer, the photoresist solution including a photoresist and a solvent, the specified amount of photoresist solution configured to provide a desired thickness of photoresist on the wafer upon evaporation of the solvent. In step 54, a volatility of the photoresist solution is controlled to allow the solvent of the photoresist solution to evaporate while the photoresist of the photoresist solution forms a film having a uniform thickness profile on the wafer, the uniform thickness profile on the wafer having a thickness equal to the particular thickness and a thickness variation less than a particular variation.

While various embodiments of the invention have been particularly shown and described, it will be understood by those skilled in the art that various changes in form and details may be made therein without departing from the spirit and scope of the invention as defined by the appended claims.

Furthermore, it should be understood that some embodiments are directed to wafer coating system 10 which is constructed and arranged to coat a wafer with a film of photoresist having a uniform thickness profile across the wafer. Some embodiments are directed to a process of coating a wafer with a film of photoresist having a uniform thickness profile across the wafer. Also, some embodiments are directed to a computer program product which enables computer logic to coat a wafer with a film of photoresist having a uniform thickness profile across the wafer.

In some arrangements, wafer coating system 10 is implemented by a set of processors or other types of control/processing circuitry running software. In such arrangements, the software instructions can be delivered controller 14 see FIG. 1 in the form of a computer program product 60, each computer program product having a computer readable storage medium which stores the instructions in a non-volatile manner. Alternative examples of suitable computer readable storage media include tangible articles of manufacture and apparatus such as CD-ROM, flash memory, disk memory, tape memory, and the like.

What is claimed is:

1. A method of coating a wafer with a film of photoresist having a uniform thickness profile across the wafer, the method comprising:
depositing a photoresist solution on a top surface of a wafer, the photoresist solution including a photoresist and a solvent, the photoresist solution configured to provide a particular thickness of photoresist on the wafer upon evaporation of the solvent; and
controlling the volatility of the photoresist solution to allow the solvent of the photoresist solution to evaporate at a specified rate concurrently with the photoresist of the photoresist solution forming a film having a uniform thickness profile at the particular thickness on the wafer;
wherein depositing the photoresist solution on the top surface of the wafer includes:
spinning the wafer on a spinning device about an axis normal to the top surface of the wafer, and
when the photoresist solution reaches the edge of the wafer, removing the wafer from the spinning device;
wherein removing the wafer from the spinning device when the photoresist solution reaches the edge of the wafer includes:
performing a detection operation at the edge of the wafer, the detection operation being configured to detect the presence of photoresist solution, and
prior to controlling the volatility of the photoresist solution, stopping the wafer from spinning on the spinning device in response to the detection operation detecting the presence of photoresist solution at the edge of the wafer.

2. A method according to claim 1,
wherein removing the wafer from the spinning device further includes:
transferring the wafer to an enclosed chamber that includes a solvent bubbler inlet; and
wherein controlling the volatility of the photoresist solution includes:
introducing gas particles into the solvent bubbler inlet, the gas particles being constructed and arranged to interact with evaporated solvent to form a gas-solvent mixture within the enclosed chamber, the gas-solvent mixture being effective to decrease the volatility of the photoresist solution.

3. A method according to claim 2,
wherein the enclosed chamber includes a hot plate; and
wherein transferring the wafer to the enclosed chamber includes:
placing the wafer on the hot plate, and
raising the temperature of the hot plate at a rate that effects a formation of the gas-solvent mixture.

4. A method according to claim 3,
wherein the hot plate includes a set of pins constructed and arranged to support the wafer above the hot plate;
wherein raising the temperature of the hot plate includes:
placing the wafer on the pins; and
lowering the pins toward the hot plate at a specified rate.

5. A method according to claim 2, further comprising:
when the uniform thickness profile of the film of photoresist on the wafer has been formed, releasing the gas-solvent mixture;
wherein depositing the photoresist solution on the top surface of the wafer includes:
depositing a specified amount of photoresist solution on the top surface of the wafer, the specified amount of photoresist solution being effective for the film to have a thickness of at least 10 μm.

6. A method according to claim 1, further comprising:
prior to depositing the photoresist solution on the top surface of the wafer, applying a pre-wet solvent to the top surface of the wafer, wherein the pre-wet solvent is compatible with the solvent of the photoresist solution.

* * * * *